United States Patent
Fukushima et al.

(10) Patent No.: US 9,502,318 B2
(45) Date of Patent: Nov. 22, 2016

(54) POLISH APPARATUS, POLISH METHOD, AND METHOD OF MANUFACTURING SEMICONDUCTOR DEVICE

(71) Applicant: KABUSHIKI KAISHA TOSHIBA, Minato-ku (JP)

(72) Inventors: Dai Fukushima, Kuwana (JP); Jun Takayasu, Yokkaichi (JP); Takashi Watanabe, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/641,734

(22) Filed: Mar. 9, 2015

(65) Prior Publication Data

US 2015/0364389 A1 Dec. 17, 2015

(30) Foreign Application Priority Data

Jun. 17, 2014 (JP) ................. 2014-124306

(51) Int. Cl.
| | |
|---|---|
| H01L 21/66 | (2006.01) |
| H01L 21/67 | (2006.01) |
| B24B 49/10 | (2006.01) |
| B24B 49/12 | (2006.01) |
| B24B 37/013 | (2012.01) |
| H01L 21/3105 | (2006.01) |

(52) U.S. Cl.
CPC ............ *H01L 22/26* (2013.01); *B24B 37/013* (2013.01); *B24B 49/105* (2013.01); *B24B 49/12* (2013.01); *H01L 21/31053* (2013.01)

(58) Field of Classification Search
CPC ............ H01L 22/26; H01L 21/67075; H01L 21/31055; B24B 49/105; B24B 49/12; B24B 37/013

USPC .................................................. 451/6, 8, 10
See application file for complete search history.

(56) References Cited

U.S. PATENT DOCUMENTS

| | | | | |
|---|---|---|---|---|
| 5,865,666 | A | * | 2/1999 | Nagahara ................ B24B 49/00 438/691 |
| 5,964,643 | A | | 10/1999 | Birang et al. |
| 6,051,500 | A | | 4/2000 | Maury et al. |
| 6,312,321 | B1 | | 11/2001 | Fukushima et al. |
| 7,052,364 | B2 | | 5/2006 | Zhang et al. |
| 2005/0118937 | A1 | | 6/2005 | Fukushima et al. |
| 2005/0218008 | A1 | | 10/2005 | Fukushima et al. |
| 2005/0245171 | A1 | * | 11/2005 | Hosaka .............. B24D 18/0009 451/6 |

(Continued)

FOREIGN PATENT DOCUMENTS

| | | |
|---|---|---|
| JP | 9-115862 A | 5/1997 |
| JP | 9-121556 | 5/1997 |

(Continued)

*Primary Examiner* — Caleen Sullivan
(74) *Attorney, Agent, or Firm* — Oblon, McClelland, Maier & Neustadt, L.L.P.

(57) ABSTRACT

A polish apparatus including a rotatable table configured to receive a polish pad having a polish surface; a polish head configured to hold a polish object and configured to be capable of placing the polish object in contact with the polish surface while holding the polish object; at least one contact portion being provided with a contact surface and configured to be capable of contacting the polish surface when the table is in rotation; and a measurement portion configured to measure a state of the contact surface of the contact portion being configured to contact the polish surface of the polish pad.

15 Claims, 9 Drawing Sheets

(56) References Cited

U.S. PATENT DOCUMENTS

| | | |
|---|---|---|
| 2006/0175296 A1 | 8/2006 | Fukushima et al. |
| 2007/0093064 A1 | 4/2007 | Fukushima et al. |
| 2007/0139043 A1 | 6/2007 | Miller et al. |
| 2007/0293047 A1 | 12/2007 | Fukushima et al. |
| 2009/0058409 A1* | 3/2009 | Fujita .................. B24B 37/013 324/230 |
| 2012/0064800 A1 | 3/2012 | Watanabe et al. |
| 2012/0309267 A1 | 12/2012 | Shinozaki et al. |
| 2014/0342640 A1 | 11/2014 | Fukushima et al. |

FOREIGN PATENT DOCUMENTS

| | | |
|---|---|---|
| JP | 9-150367 | 6/1997 |
| JP | 10 58313 | 3/1998 |
| JP | 10-296615 | 11/1998 |
| JP | 10-321567 | 12/1998 |
| JP | 11-90818 | 4/1999 |
| JP | 11-354477 | 12/1999 |
| JP | 2000-202758 | 7/2000 |
| JP | 2001-15467 | 1/2001 |
| JP | 2001-205554 | 7/2001 |
| JP | 2002-299294 | 10/2002 |
| JP | 2003-236749 | 8/2003 |
| JP | 2004-106123 | 4/2004 |
| JP | 2005-123232 | 5/2005 |
| JP | 2005-294707 | 10/2005 |
| JP | 2006-222285 | 8/2006 |
| JP | 2006-281384 | 10/2006 |
| JP | 2007-15107 | 1/2007 |
| JP | 2007-115886 | 5/2007 |
| JP | 2007-317702 | 12/2007 |
| JP | 2008-502493 A | 1/2008 |
| JP | 2009-246228 | 10/2009 |
| JP | 2010-64220 | 3/2010 |
| JP | 4495398 | 7/2010 |
| JP | 2011-62812 | 3/2011 |
| JP | 2011-249833 | 12/2011 |
| JP | 2011-252910 | 12/2011 |
| JP | 2012-56029 | 3/2012 |
| JP | 2012-250309 | 12/2012 |
| JP | 5298688 B2 | 9/2013 |
| JP | 2014-223684 | 12/2014 |

* cited by examiner

POLISH APPARATUS, POLISH METHOD, AND METHOD OF MANUFACTURING SEMICONDUCTOR DEVICE

CROSS-REFERENCE TO RELATED APPLICATIONS

This application is based upon and claims the benefit of priority from Japanese Patent Application No. 2014-124306, filed on, Jun. 17, 2014 the entire contents of which are incorporated herein by reference.

FIELD

Embodiments disclosed herein generally relate to a polish apparatus, a polish method, and a method of manufacturing a semiconductor device.

BACKGROUND

Semiconductor devices are manufactured by increasingly complex process steps and with increasingly dense element integration. Thus, in semiconductor device manufacturing, high processing controllability is required not only in the lateral direction but also in the vertical direction. The amount of polishing by chemical mechanical polishing (CMP) tend to increase as the steps or undulations in the device structure become greater with increased complexity of the process steps and as more and more layers are stacked with increased element density.

The condition or the state of the polish pad used in CMP changes over repetitive use by wear, deformation, etc. The change in the condition or the state of the polish pad increases with polish amount and thus, has greater influence on polish performance as the polish pad is used more heavily. The change in the state of the polish pad may destabilize the polish properties and may cause variations in the polish results.

DESCRIPTION

In one embodiment, a polish apparatus including a rotatable table configured to receive a polish pad having a polish surface; a polish head configured to hold a polish object and configured to be capable of placing the polish object in contact with the polish surface while holding the polish object; at least one contact portion being provided with a contact surface and configured to be capable of contacting the polish surface when the table is in rotation; and a measurement portion configured to measure a state of the contact surface of the contact portion being configured to contact the polish surface of the polish pad.

In one embodiment, a method of polishing includes measuring a state of a contact portion by placing the contact portion in contact with a polish surface of a polish pad during a polish operation; determining a state of the polish pad based on a result of the measuring; and polishing a polish object, based on a result of the determining, by placing the polish object in contact with the polish surface.

In one embodiment, a method of manufacturing a semiconductor device includes forming a pattern above a semiconductor substrate; forming a target polish layer above the pattern; measuring a state of a contact portion by placing the contact portion in contact with a polish surface of a polish pad during a polish operation; determining a state of the polish pad based on the result of the measuring; and polishing a polish object, based on a result of the determining, by placing the polish object in contact with the polish surface.

EMBODIMENTS

Embodiments are described herein with reference to the accompanying drawings. Structures substantially identical across the embodiments are identified with identical reference symbols and are not re-described.

First Embodiment

Figure 1:
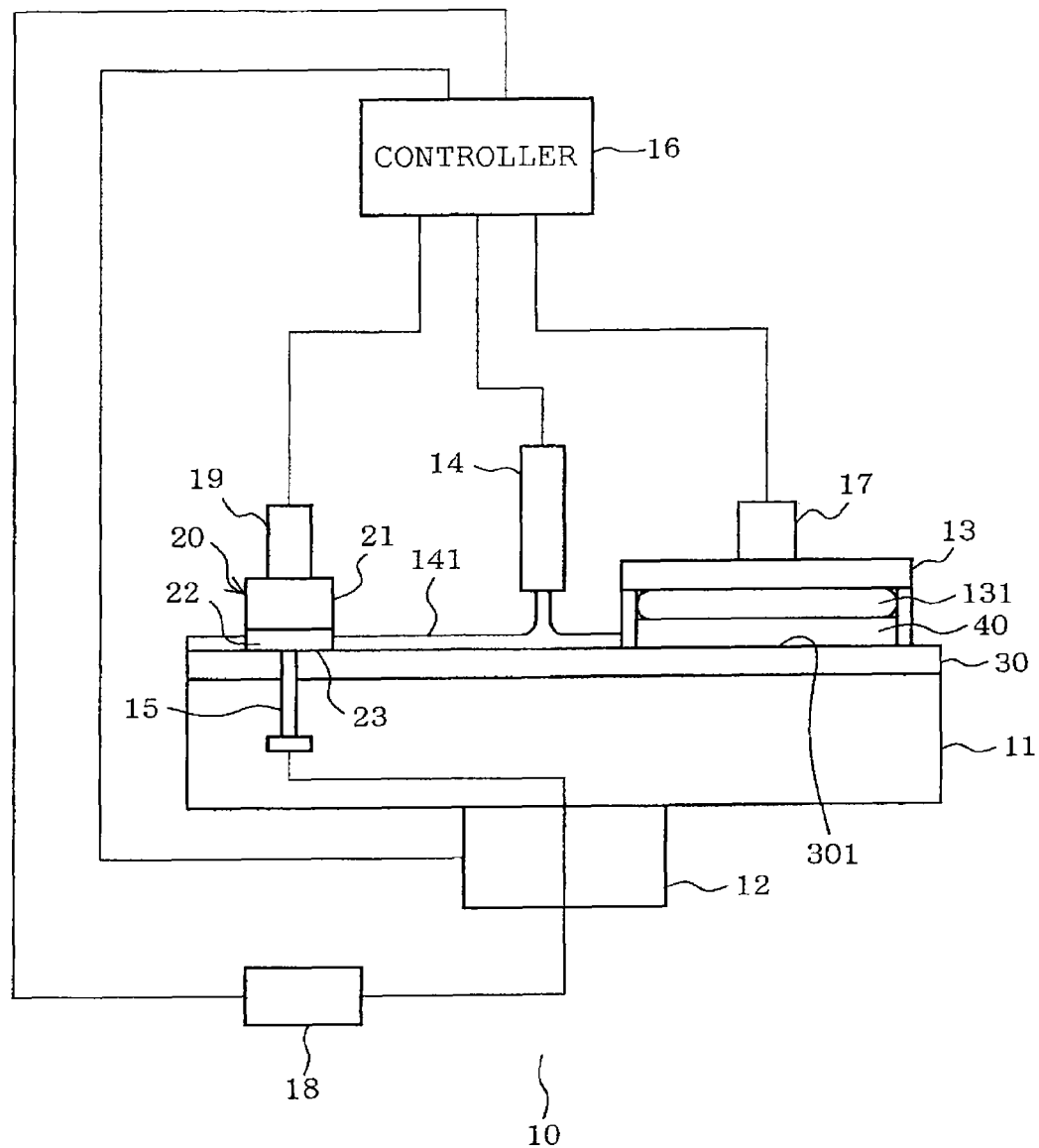
FIG. 1 pertains to a first embodiment and illustrates one example of the overall structure of a polish apparatus.

First, a brief description will be given on polish apparatus 10 illustrated in FIG. 1. Polish apparatus 10 is provided with table 11, table drive portion 12, polish head 13, slurry supplier 14, sensor head 15, controller 16, and indenter 20. Table 11 is generally shaped like a circular disc. Polish pad 30 is mounted on a polish head 13 side, in other words, the upper surface side of table 11. Table 11 is driven by table drive portion 12 and is rotated with polish pad 30 placed on its upper side.

Polish pad 30 is configured to contact the polish object when polishing the polish object. Polish pad 30 is generally shaped like a circular disc. Polish pad 30 primarily comprises for example a foamable polyurethane resin. Polish pad 30 may comprise for example a stack of a polish layer and a layer softer than the polish layer. Polish pad 30 is disposed so that the polish layer side faces up so as to face polish head 13 side. Polish pad 30 is provided with polish surface 301 on a surface located in polish head 13 side, in other words, on an upper end surface in the gravitational direction.

Polish head 13 faces polish pad 30 disposed above table 11. In other words, polish head 13 is disposed above table 11. Further, polish head 13 is provided so as to be displaced toward one side of the rotation center of table 11. Polish head 13 is configured to hold wafer 40, which is one example of a polish object, in the lower side thereof facing table 11. The thickness of wafer 40 relative to the dimensions of polish pad 30, etc. is exaggerated from the actual relation.

Polish head 13 is provided for example with air bag 131 capable of expanding and contracting by increasing and decreasing air pressure. Polish head 13 is capable of applying pressure to wafer 40 while holding wafer 40 by inflating air bag 131. Wafer 40 is thus, held by polish head 13 and pressed downward against polish surface 301 of polish pad 30 with a predetermined pressure. Polish head 13 is driven in rotation by polish head drive portion 17. Wafer 40 is thus, rotated with polish head 13.

Slurry supplier 14 supplies slurry 141 containing water, abrasive grains, and surfactant for example to polish surface 301 of polish pad 30. Slurry 141 supplied from slurry supplier 14 flows into the space between wafer 40 held by polish head 13 and polish surface 301 of polish pad 30 when polishing wafer 40. Wafer 40 held by polish head 13 is pressed against polish pad 30 with appropriate pressure. Thus, the surface of wafer 40 is polished through contact with polish surface 301 of polish pad 30. In this example, slurry 141 contains abrasive grains and a surfactant. The abrasive grains facilitate the polishing while the surfactant, which is one example of an additive, suppresses the polishing. The polish rate may be adjusted by controlling the pressure applied by polish head 13, the rotation speed of polish head 13 and table 11, and the mixture ratio of abrasive grains and surfactant.

Indenter 20 is one example of a contact portion capable of contacting contact surface 301 of polish pad 30 during the rotation of table 11. Indenter 20 is provided so as to face polish pad 30 provided on table 11. In other words, indenter 20 is provided above table 11. Indenter 20 is displaced toward one side of the rotation center of table 11. In the first embodiment, indenter 20 is driven up and down while being held by indenter holder 19. Thus, indenter 20 contacts polish surface 301 of polish pad 30 with a predetermined force during the rotation of table 11, that is, during the rotation of polish pad 30. The diameter of indenter 20 is approximately 20 mm for example.

Indenter 20 is generally shaped like a circular disc or a circular cylinder for example and is provided with main body portion 21 and contact layer 22. In the first embodiment, main body portion 21 comprises for example a metal material, a resin material, a ceramic material, or the like. Contact layer 22 is provided on polish surface 301 side of main body portion 21 and comprises for example a metal layer, a silicon oxide layer serving as the polish target layer, a silicon nitride layer serving as a stopper layer, or the like. The surface of indenter 20 in polish surface 301 side is referred to as contact surface 23 configured to contact polish surface 301. The thickness of contact layer 22 relative to the dimensions of indenter 20 is exaggerated from the actual relation. Contact surface 23 of indenter 20 is polished when table 11 is rotated with contact surface 23 placed in contact with polish surface 301 of polish pad 30.

Sensor head 15 is one example of a measurement portion configured to obtain a measurement of the state of contact layer 22 of indenter 20. Polish apparatus 10 is capable of indirectly measuring the state of polish pad 30 by measuring the state of polish layer 22 of indenter 20. In this example, sensor head 15 may measure the thickness of contact layer 22 to represent the state of contact layer 22. More specifically, polish apparatus 10 executes the polish operation by supplying slurry 141 while rotating table 11, and contact layer 22 is polished by placing contact surface 23 of indenter 20 in contact with polish surface 301 of polish pad 30 during the polish operation. Sensor head 15 measures the amount of variation in the thickness of contact layer 22 resulting from the polishing, in other words, the variation in the polish rate. Polish apparatus 10 measures the state of polish pad 30 based on the variation of polish rate.

For example, when the conditions of the polish operation such as the rotation speed of table 11, mixture ratio of abrasive grains and surfactant in slurry 141, and the like are steady before and after the change in the polish rate, the variation in the polish rate can be deemed to have originated from the variation in the state of polish pad 30. Thus, polish apparatus 10 is capable of measuring the current state of polish pad 30, in other words, the polish rate with respect to the polish target layer by measuring the state of contact layer 22 of indenter 20 during the polish operation. Actual polishing of wafer 40 may or may not be carried out during the polish operation.

Sensor head 15 is embedded into table 11. Sensor head 15 rotates with table 11 and passes below indenter 20. Sensor head 15, when passing below indenter 20, measures the state of contact layer 22 which is, in this example, the thickness of contact layer 22. The result of measurement by sensor head 15 is transmitted to controller 16 for example via amplifier 18 or the like.

The measurement method of sensor head 15 varies depending upon the type of contact layer 22 and examples of such methods may include an eddy current method or an optical method. Polish apparatus 10 employs one or a combination of measurement methods depending upon the type of contact layer 22. The eddy current method may be used for example when contact layer 22 is a metal layer. When employing the eddy current method, sensor head 15 is provided with a coil not illustrated connected to a high-frequency AC (alternating current) power supply, and the line of magnetic force is produced from the coil in the direction to penetrate through table 11. When the line of magnetic force passes through contact layer 22 comprising an electrically conductive metal layer, eddy current is produced in contact layer 22. The size of eddy current varies depending on the resistance of contact layer 22, in other words, the thickness of contact layer 22. On the other hand, when eddy current is produced in contact layer 22, the line of magnetic force is produced in the direction opposite the direction of the line of magnetic force produced by sensor head 15. By measuring the strength of this line of magnetic force produced in the opposite direction, it is possible to measure the variation in the thickness of contact layer 22 comprising a metal layer.

Further, when contact layer 22 is an insulating film such as an oxide film, a nitride film, or the like, the optical method is employed as the measurement method of sensor head 15. When employing the optical method, sensor head 15 is provided with a light projecting portion and a light receiving portion not illustrated. Some of the light radiated from the light projecting portion reflects off of contact surface 23 while the remainder is transmitted through contact layer 22 and reflects off the boundary surface between main body portion 21 and contact layer 22. The light receiving portion receives the synthetic light of the light reflecting off of contact surface 23 and the light reflecting off of the boundary surface between main body portion 21 and contact layer 22. Because of the phase difference in the light reflecting off of contact surface 23 and the light reflecting off of the boundary surface between main body portion 21 and contact layer 22, difference is observed in the strength of the reflective light (such as weak or strong), being a synthetic light. In other words, the variation in the thickness of contact layer 22 causes a variation in the phase difference in the reflective light which in turn causes a periodic variation in the strength of light received by the light receiving portion. It is possible to measure the variation in the thickness of contact layer 22 by measuring the variation in the strength of the light received.

Sensor head 15 of the first embodiment is capable of measuring the variation in the thickness, in other words, the variation in the amount of polishing of contact layer 22 provided in indenter 20 as described above. Thus, sensor head 15 may be used as an end point detector for obtaining the endpoint of the polishing in the polish process of wafer 40. Stated differently, when polish apparatus 10 is provided with the above described eddy current method sensor or an optical method sensor as an endpoint detector in polishing wafer 40, the sensors may be used as a measurement portion for measuring the state of contact layer 22 of indenter 20.

Controller 16 is connected to table drive portion 12, polish head drive portion 17, indenter holder 19, and the like. Controller 16 is configured by a computer in which software programs are executed. Controller 16 is responsible for the overall control of polish apparatus 10. Controller 16 determines or evaluates the state or the condition of polish pad 30 prior to or during the polish process of wafer 40, being the polish object in this example. Controller 16 is further configured to determine whether or not polish pad 30 is to be replaced and specify the polish conditions such as the rotation speed of table 11, the level of pressure applied to wafer 40, the mixture ratio of abrasive grains and surfactant contained in slurry 141, and the like based on the result of determination.

Figure 2A:
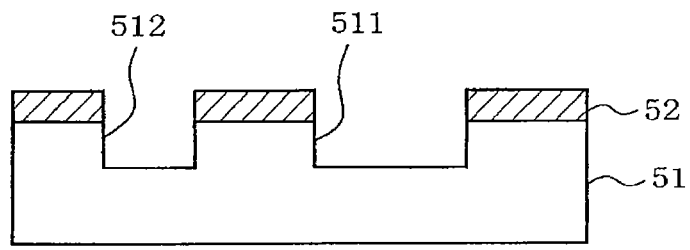
FIGS. 2A, 2B, and 2C pertain to the first embodiment and are examples of cross-sectional views of a semiconductor device arranged in a sequence of one example of a manufacturing process flow of the semiconductor device.

Referring next to FIG. 2, a description is given on a method of manufacturing a semiconductor device using polish apparatus 10. As illustrated in FIG. 2A, silicon nitride film 52 serving as a stopper film is formed above silicon substrate 51 in the thickness of approximately 70 nm for example. Though not illustrated, silicon nitride film 52 and silicon substrate 51 are thereafter etched using a silicon oxide film or the like as a mask to form trenches 511 and 512 serving as STI patterns having depth of approximately 450 nm for example. A silicon oxide film for example may be provided between silicon substrate 51 and silicon nitride film 52.

Figure 2B:
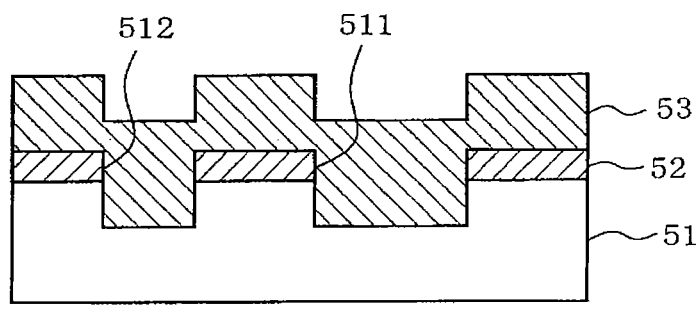

Referring now to FIG. 2B, silicon oxide film 53 is formed for example by high density plasma CVD (HDP-CVD) in the thickness of approximately 600 nm for example so as to fill trenches 511 and 512 serving as an STI pattern. In this example, the surface of silicon oxide film 53 is contoured so as to follow the contours of trenches 511 and 512.

Figure 2C:
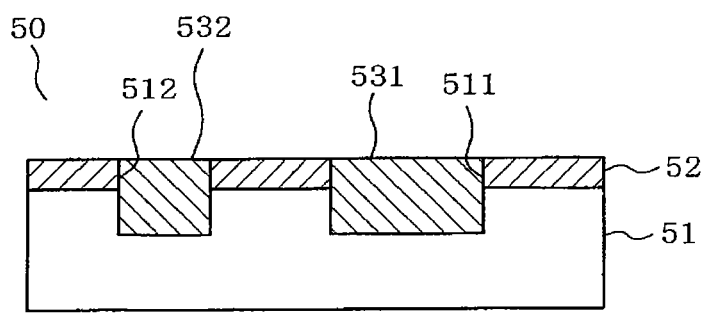

Referring now to FIG. 2C, silicon oxide film 53 serving as a polish target layer is polished by CMP (Chemical Mechanical Polishing) using polish apparatus 10. Silicon nitride film 52 serving as a stopper layer is exposed by being polished by CMP to obtain semiconductor storage device 50 in which trenches 511 and 512 are filled with silicon oxide films 531 and 532 as illustrated in FIG. 2C.

Figure 3:
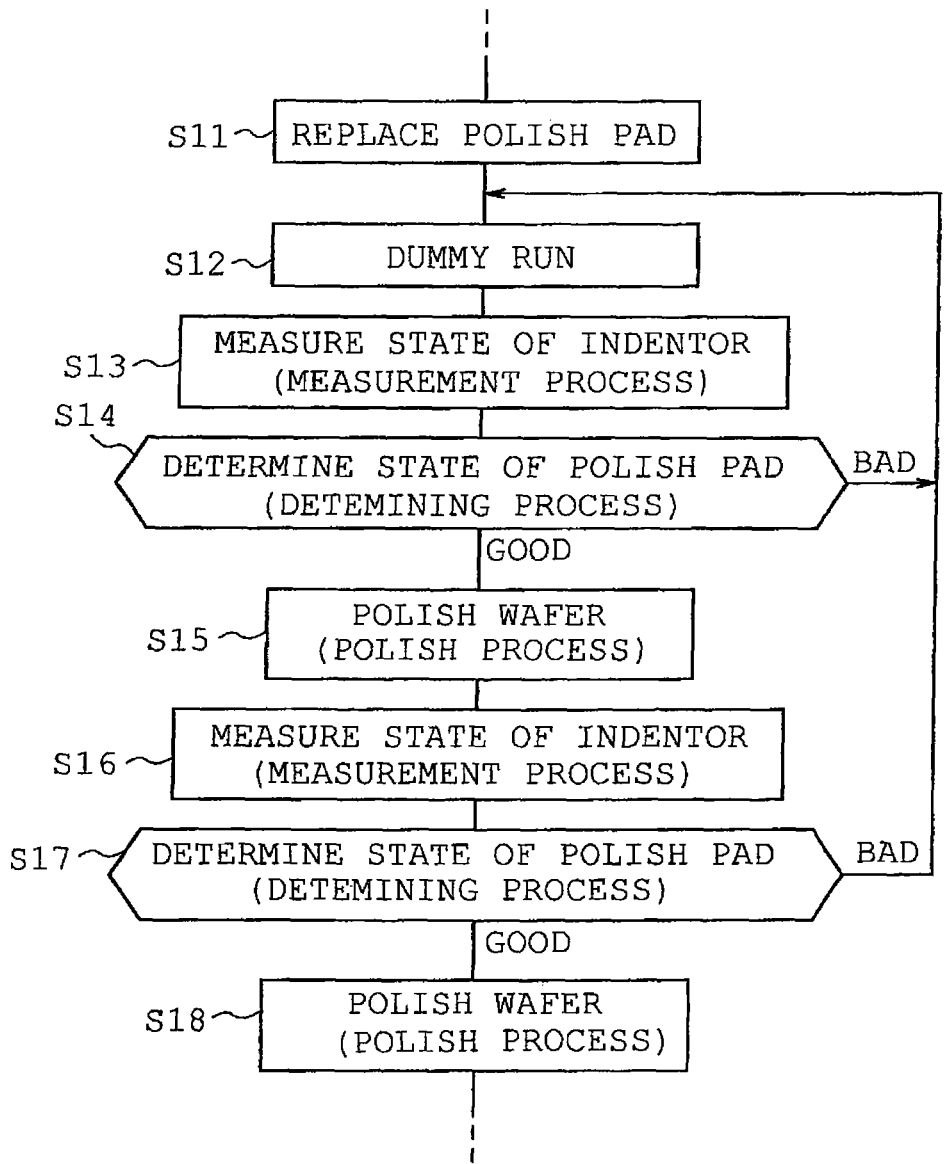
FIG. 3 pertains to the first embodiment and is one example of a flowchart indicating a portion of a process step executed by the polish apparatus.

Referring next to FIG. 3, a description will be given on the polishing of wafer 40 carried out in the manufacturing process flow of multiple semiconductor devices 50. The process step for obtaining the measurement of the state of the contact surface of indenter 20 is hereinafter referred to as a measurement process. The process step for determining or evaluating the state of polish pad 30 based on the result of measurement obtained in the measurement process is hereinafter referred to as a determination process. The process step for polishing wafer 40 serving as the polish object in this example is hereinafter referred to as a polish process.

When polish pad 30 of polish apparatus 10 is replaced, the replacement polish pad 30 is normally used repeatedly for polishing multiple wafers. Among the process steps executed by polish apparatus 10, the flowchart of FIG. 3 indicates the process steps carried out during certain time period after polish pad 30 has been replaced.

When polish pad 30 is replaced with a new polish pad 30 at step S11, polish apparatus 10 executes a dummy run to prepare polish pad 30 for actual run. In the dummy run, polish apparatus 10 polishes a dummy wafer for approximately 5 minutes for example. The dummy wafer may be a bare wafer with no films formed thereon or a patterned wafer. The dummy wafer may alternatively be covered by a blanket film in which a polish target layer or a stopper layer is formed across the entire surface of the wafer. The blanket film may be a flat unpatterned film or may have undulations. It is not required for the dummy run to polish a dummy wafer. For example, a dummy run simply carried out by rotating table 11 and supplying slurry 141 without polishing a wafer will suffice.

After completing the dummy run at step S12, polish apparatus 10 proceeds to step S13 in which the state of contact surface 23 of indenter 20 is measured. As described earlier, polish apparatus 10 places contact surface 23 of indenter 20 in contact with polish surface 301 of polish pad 30 at a predetermined pressure during the polish operation and measures the state of contact surface 23, in other words, the polish rate using sensor head 15. At this instance, by configuring contact layer 22 of indenter 20 to be of the same material as the polish target layer of wafer 40, it is possible for polish apparatus 10 to detect the polish rate of the polish target layer before the polish target layer of wafer 40 is actually polished.

Then at step S14, polish apparatus 10 determines the state of polish pad 30 based on the result of measurement obtained at step S13. At step S14, polish apparatus 10 determines that the state of polish pad 30 is not good (BAD in step S14) when the polish rate measured at step S13 is outside the predetermined range and returns to step S12 to repeat the execution of the dummy run. On the other hand, when the polish rate measured at step S13 is within the predetermined range, polish apparatus 10 determines that the state of polish pad 30 is good (GOOD at step S14) and proceeds to step S15 to polish wafer 40 serving as the polish object. Then, polish apparatus 10 repeats process steps similar to steps S13, S14, and S15 in steps S16, S17, S18 . . . to polish multiple wafers 40. When polish apparatus 10 has polished a predetermined number of wafers 40, polish apparatus 10 returns to step S11 and replaces polish pad 30.

Polish apparatus 10 may be configured to make adjustments in the polish conditions to be applied in steps S15, S18 . . . based on the result of determination on the state of polish pad 30 in steps S14, S17 . . . . For example, when the polish rate measured at step S13 is low and a determination is made that the state of polish pad 30 is not good at step S14, adjustments may be made to improve the polish rate to be followed in the polish process of step S15 by for example, increasing the rotation count of table 11 or increasing the ratio of abrasive grains contained in slurry 141. On the other hand, when the polish rate measured at step S13 is high, adjustments may be made to reduce the polish rate to be followed in the polish process of step S15 by for example, reducing the rotation count of table 11 or increasing the ratio of surfactant contained in slurry 141.

Further, polish apparatus 10 may be configured to measure the state of indenter 20 in real time in the polish processes carried out in steps S15 and S18 and modify the polish conditions based on the result of measurement.

Still further, polish apparatus 10 may be configured to prompt the replacement of polish pad 30 when a predetermined count of "BAD" judgments have been made at steps S14, S17 . . . .

Polish pad 30 is normally configured to polish multiple wafers 40. In doing so, the surface state of polish pad 30 may change by deformation caused by polish dust, the applied pressure, or the like. As a result, influence of polish surface 301 of polish pad 30 on the polishing of wafer 40 is increased and causes a change in the polish conditions such as the polish rate. Conventionally, wafer polishing was continued without making further determinations on the state of the polish pad once the state of the polish pad was determined to be good in the dummy run performed after polish pad replacement. Thus, it was conventionally not possible to detect the change in the state of the polish pad resulting from polishing until the wafer was actually polished and the result of polishing was measured. This has led to variations in the polish results and was one of the reasons inhibiting yield improvement.

In the first embodiment, polish apparatus 10 is capable of dynamic measurement of the state of polish pad 30, while rotating table 11, before or during the actual polishing of wafer 40. It is thus, possible to specify the polish conditions suitable to the current state of polish pad 30 and determine whether to allow/disallow the use of polish pad 30. As a result, it is possible to reduce the influence of the change in the state of polish pad 30 caused by polishing and thereby reduce the variation in the polish result of wafer 40 which in turn improves the productivity of semiconductor device manufacturing.

Further, in the first embodiment, polish apparatus 10 is capable of measuring the state of polish pad 30 under the conditions applied in the actual polish process in which table 11 is rotated at the rotation speed of the actual polish process with the supply of slurry 141. Polish apparatus 10 is thus, capable of accurate detection of the change in the state of polish pad 30 resulting from polishing.

Indenter holder 19 may be configured so that its depression pressure can be adjusted to a given level. In other words, the pressure applied by the depression of indenter 20 on polish surface 301 of polish pad 30 may be variable. The polish rate varies with the variation in the pressure applied when depressing wafer 40 with polish head 13. Thus, it is possible to learn the appropriate polish rate dependent on the depression pressure levels by controlling the depression pressure applied by indenter 20 in concert with the depression pressure applied to wafer 40.

Second Embodiment

Figure 4:
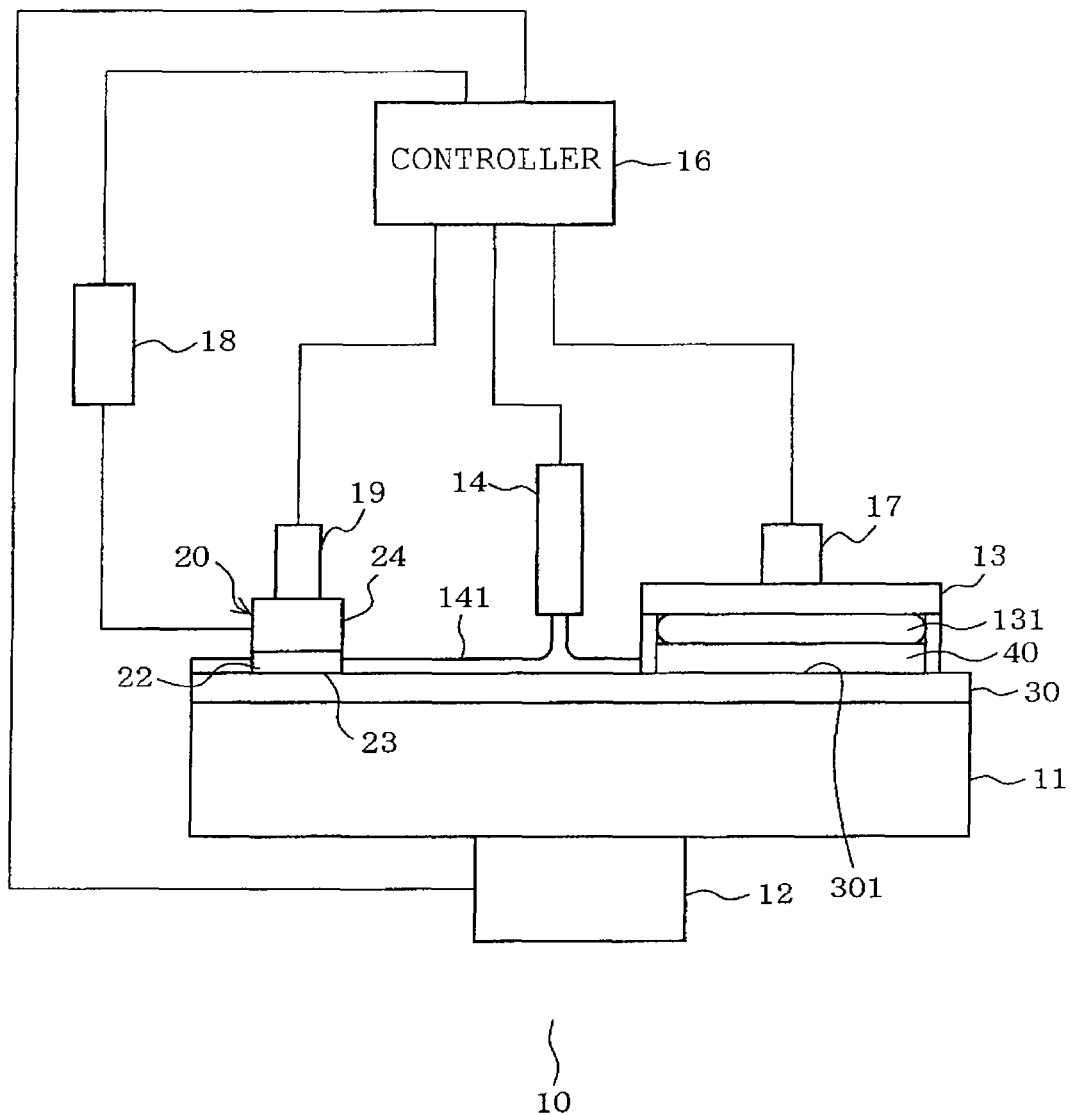
FIG. 4 pertains to a second embodiment and is one example of the overall structure of a polish apparatus.

Next, a description is be given on a second embodiment with reference to FIG. 4. The second embodiment differs from the first embodiment in that the state of contact surface 23 of indenter 20 is measured in a different manner. More specifically, main body 21 of indenter 20 of the first embodiment is replaced by a main body 24 comprising a crystal oscillator in the second embodiment as illustrated in FIG. 4. Main body 24 is provided with an electrode for picking up signals and is connected to controller 16 by way of amplifier 18. Contact surface 23 of main body 24 is formed of contact layer 22 as was the case in the first embodiment. Contact layer 22 may comprise materials identical to a polish target layer such as a silicon oxide film or a metal film, or a stopper film such as a silicon nitride film.

Application of voltage to main body 24 causes indenter 20 to oscillate by piezoelectric effect of the crystal oscillator. In this example, the resonant frequency of indenter 20 varies with the mass of contact layer 22, that is, the thickness of the contact layer 22 provided that the properties of the crystal oscillator are the same. Thus, polish apparatus 10 polishes contact layer 22 of indenter 20 and measures the variation in the resonant frequency of contact layer 22 to obtain the measurement of the polish rate of contact layer 22. Polish apparatus 10 is thus capable of detecting the current state of polish pad 30. In this example, indenter 20 serves as one example of the contact portion as well as one example of the measurement portion.

The second embodiment provides the operation and effect similar to those of the first embodiment.

The second embodiment may be modified so that contact layer 22 of indenter 20 may be replaced by an adsorption layer comprising a material which adsorbs surfactant contained in slurry 141 with ease. In such example, the variation in the weight of the adsorption layer of indenter 20 after it has adsorbed the surfactant within the slurry causes a variation in the resonant frequency of indenter 20. Polish apparatus 10 is thus, capable of determining the current state of polish pad 30 based on the measurement of the amount of surfactant adsorbed by the adsorption layer.

Third Embodiment

Figure 5:
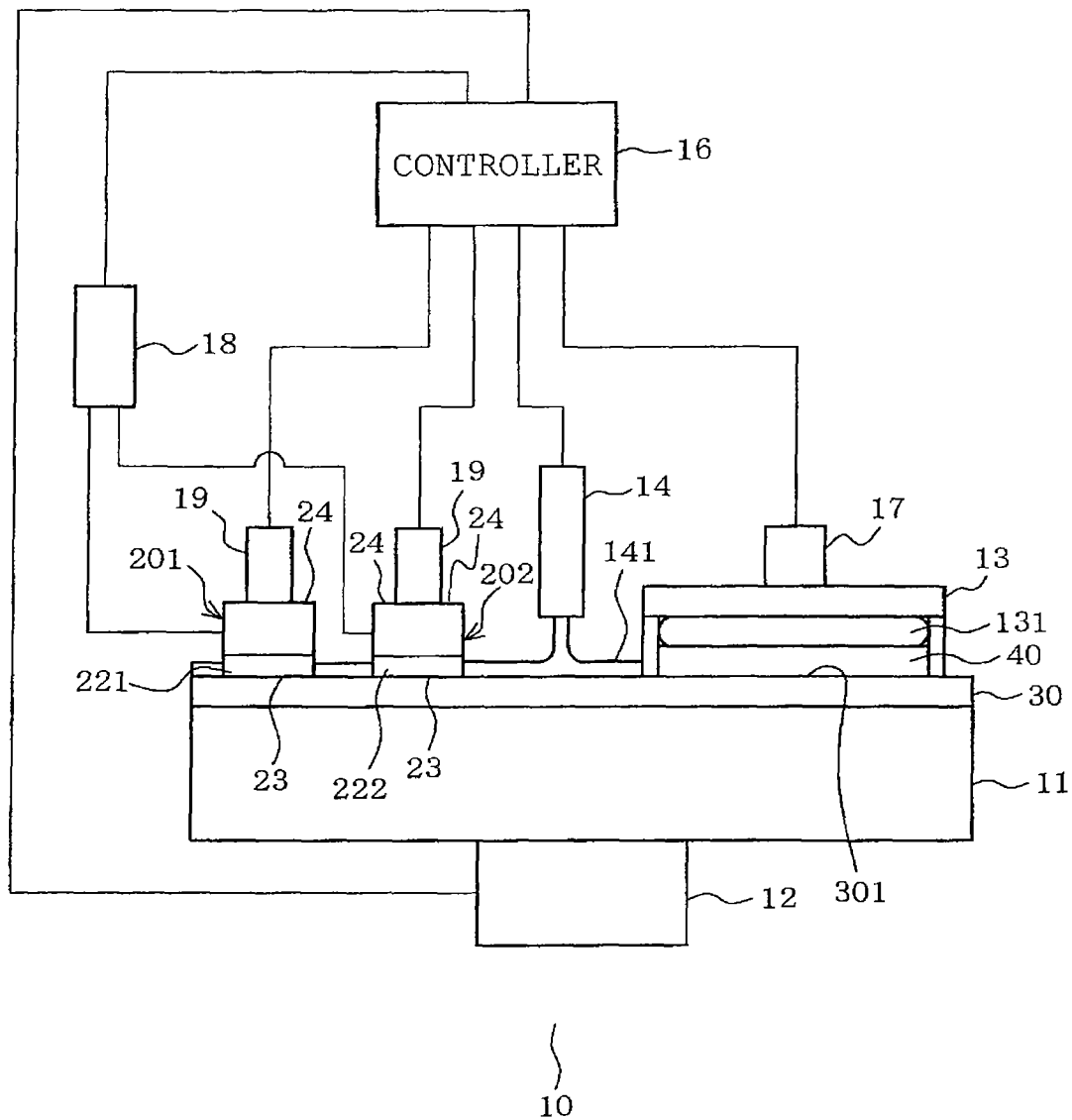
FIG. 5 pertains to a third embodiment and is one example of the overall structure of a polish apparatus.

Next a description will be given on a third embodiment with reference to FIG. 5 to FIG. 7. In the third embodiment, polish apparatus 10 is provided with a plurality of indenters 20 (contact portions). FIG. 5 illustrates two indenters 20 for ease of explanation, however polish apparatus 10 of the third embodiment may contain more than two indenters 20. The two indenters 20 are hereinafter referred to as first indenter 201 (first contact portion) and second indenter 202 (second contact portion). Thus, polish apparatus 10 of the third embodiment is provided with at least two contact portions, namely first indenter 201 and second indenter 202.

Contact layers 22 of the plurality of indenters 20 each comprises a polish target layer or stopper layer which correspond to those provided above wafer 40. For example, when polishing semiconductor substrate 51 provided with silicon nitride film 52 serving as a stopper film and silicon oxide film 53 serving as a polish target film above semiconductor substrate 51 as illustrated in FIG. 7 with polish apparatus 10, contact layer 221 of first indenter 201 is a blanket film of a silicon oxide layer serving as the polish target layer. Contact layer 222 of second indenter 202 is a blanket film of a silicon nitride layer serving as the stopper layer. In FIG. 7, the layer of silicon oxide film 53 represented by range L1 is referred to as the first layer and the layer of silicon oxide film 53 represented by range L2 is referred to as the second layer. Silicon nitride film 52 indicated by L3 is referred to as the third layer.

Figure 6:
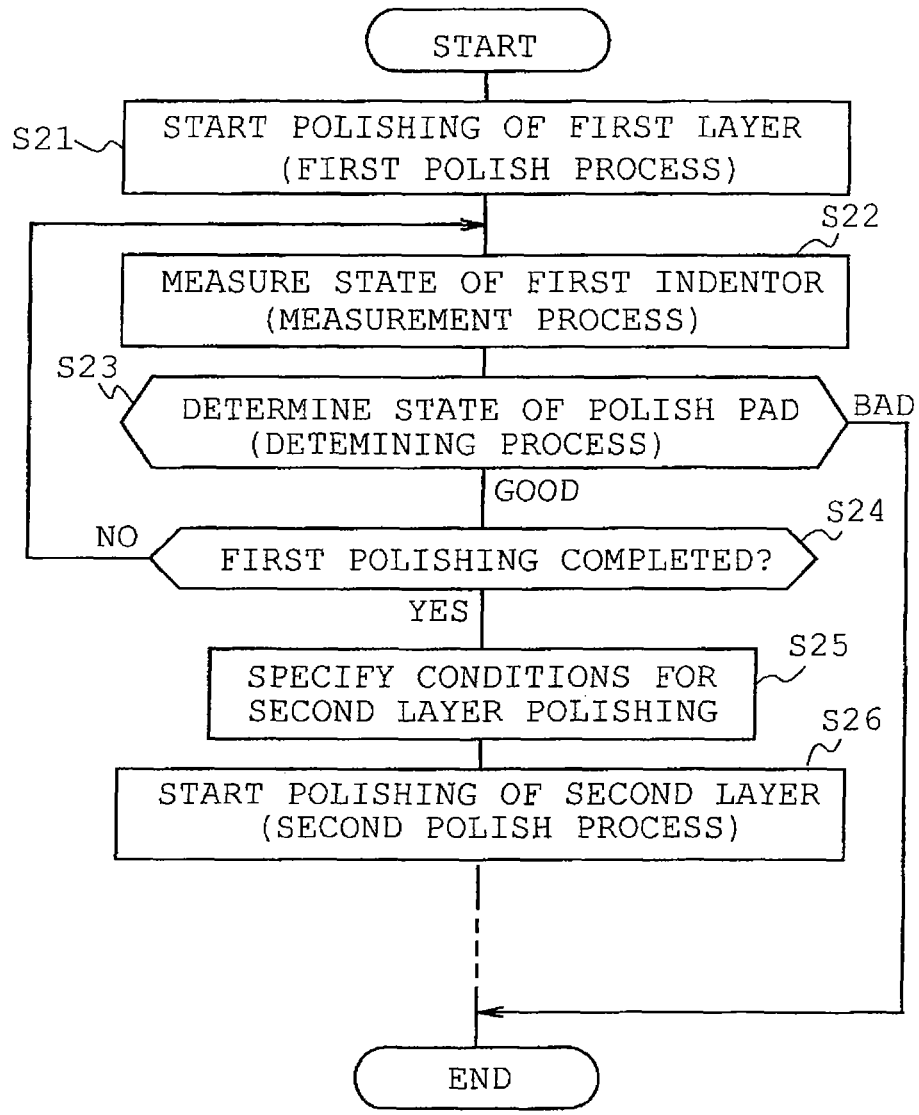
FIG. 6 pertains to the third embodiment and is one example of a flowchart indicating a portion of a process step executed by the polish apparatus.
Figure 7A:
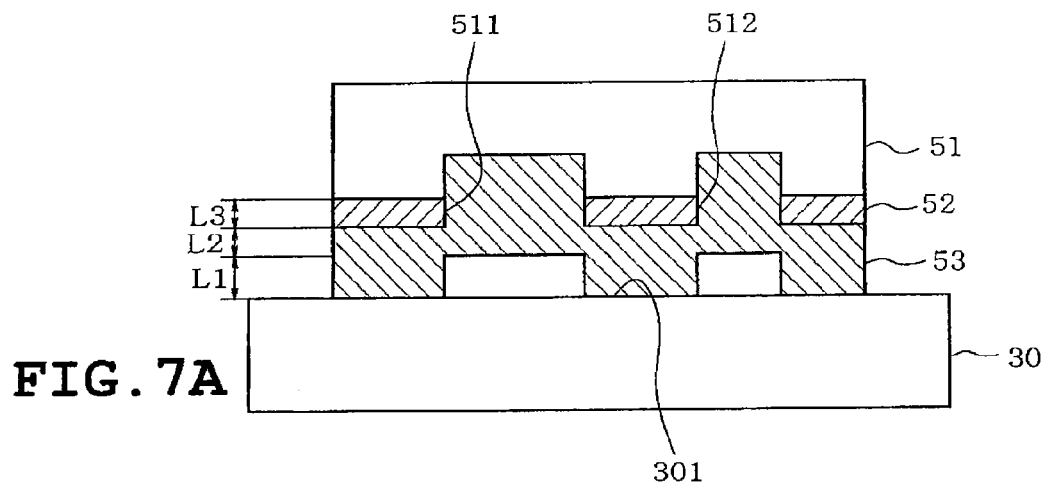
FIGS. 7A, 7B, and 7C pertain to the third embodiment and are examples of cross-sectional views of a semiconductor device arranged in a sequence of one example of a polish process flow.

First, polish apparatus 10 polishes first layer L1 as indicated in step S21 of FIG. 6 and as illustrated in FIG. 7A. Then, polish apparatus 10 determines the state of first indenter 201 as indicated in step S22 of FIG. 6. In this example, contact layer 221 of first indenter 201 is a blanket film of a silicon oxide layer. Thus, polish apparatus 10 is capable of detecting the polish rate of an unpolished second layer L2 by determining the state of first indenter 201.

Figure 7B:
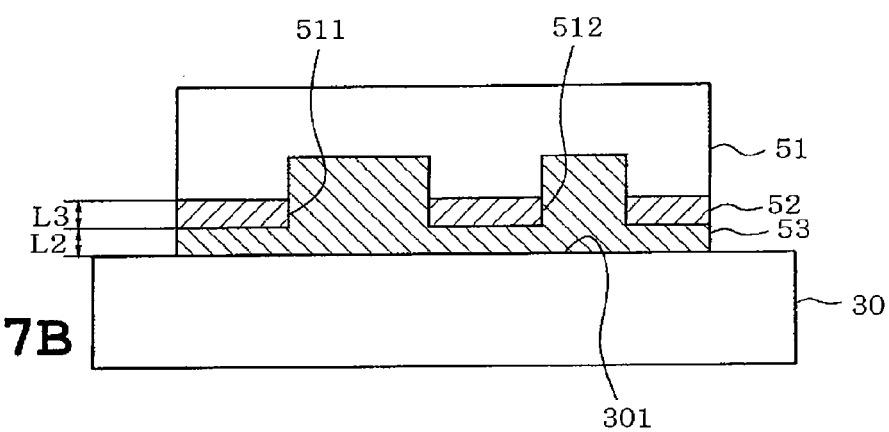
Figure 7C:
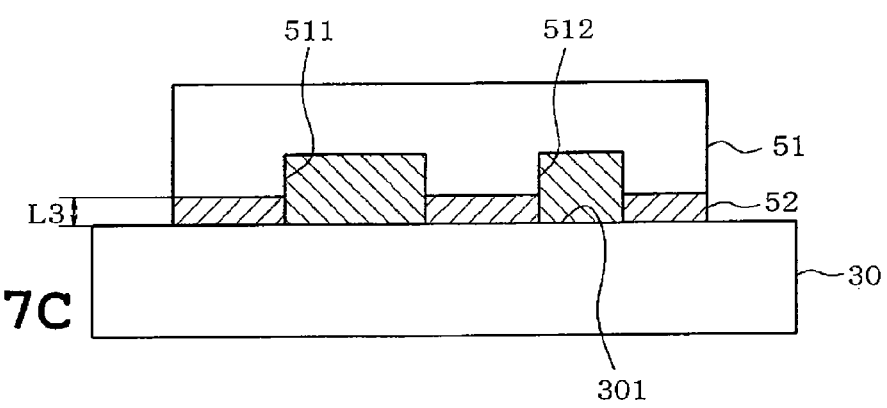

Then, polish apparatus 10 determines the state of polish pad 30 at step S23 and if determined to be still usable (GOOD at step S23), proceeds to step S24. Polish apparatus 10 continues the polish process (NO at step S24) by repeating steps S22 to S24 until second layer L2 is exposed and polishing of first layer L1 is completed. When the polishing of first layer L1 is completed (YES at step S24) as illustrated in FIG. 7B, polish apparatus 10 proceeds to step S25 and specifies the polish conditions for the second layer L2 based on the polish rate of second layer L2 measured at step S22. Then, polish apparatus 10 proceeds to step S26 and starts the polishing of second layer L2. Thereafter, polish apparatus 10 repeats steps similar to steps S22 to S24 for second layer L2 and polishes second layer L2. Then, when third layer L3 is exposed as illustrated in FIG. 7C, the polish process is completed. When multiple layers are stacked above silicon substrate 51 and further layers such as the fourth layer and the fifth layer need to be polished, steps similar to steps S21 to S24 are repeated for such number of stacked layers.

In the above described method, the polish process for polishing wafer 40 includes a first polish step for polishing the first layer and a second polish step for polishing the second layer after carrying out the first polish step. Polish apparatus 10 is configured to measure the polish rate of the second layer, representing the current state of polish pad 30, by carrying out a measurement process during the first polish step. Then, polish apparatus 10 specifies the polish conditions for the second polish step based on the result of measurement and proceeds to carry out the second polishing step. As a result, polish apparatus 10 is capable of detecting the current state of polish pad 30 with accuracy. Polish apparatus 10 is thus, capable of detecting the polish rate of the layer to be polished after the layer being currently polished. It is thus, possible to specify the polish conditions suitable with the current state of polish pad 30 or determine whether to allow/disallow further use of polish pad 30 prior to the actual polishing of the polish target layer. As a result, it is possible to reduce the influence of the change in the state of polish pad 30 caused by polishing and thereby reducing the variation in the finishing of semiconductor device 50 which in turn improves productivity.

Fourth Embodiment

Figure 8:
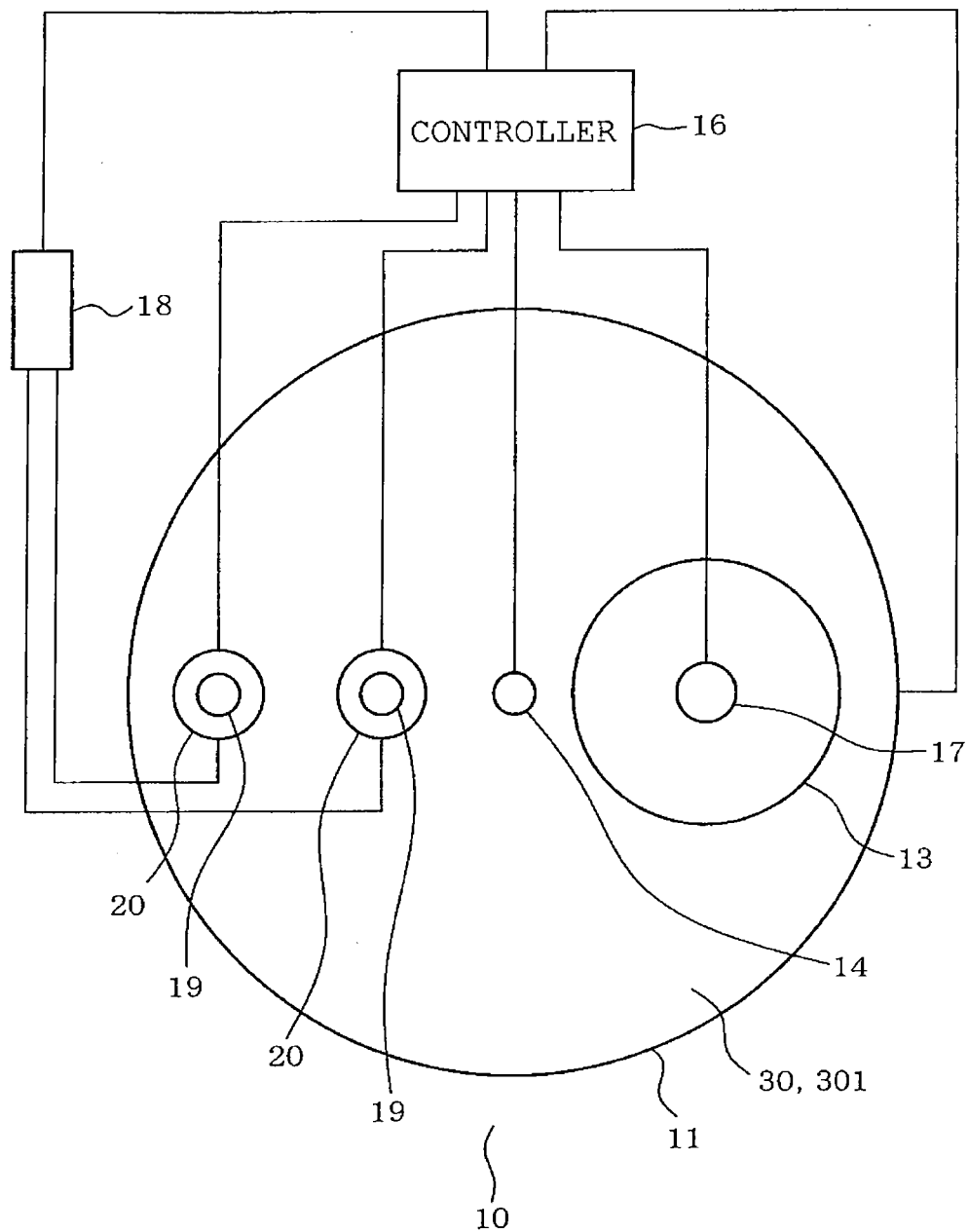
FIG. 8 pertains to a fourth embodiment and is one example of a plan view illustrating an overall view of a polish apparatus.

Next, a description will be given on a fourth embodiment with reference to FIG. 8. In the fourth embodiment, polish apparatus 10 is provided with a plurality of indenters 20 (contact portions). FIG. 8 illustrates two indenters 20 for ease of explanation, however polish apparatus 10 of the fourth embodiment may contain more than two indenters 20. Indenters 20 are similar in structure to the first embodiment and are displaced from one another in the radial direction of table 11. In other words, the multiple indenters 20 are disposed along the diametric dimension of polish pad 30.

The circumferential velocity of a given point on polish pad 30 when table 11 is in rotation varies with the distance from the center of rotation. Thus, the change in the state of polish pad 30 caused by polishing differs depending upon the radial location of polish pad 30. In the fourth embodiment, multiple indenters 20 are disposed on polish pad 30 so as to be displaced from one another over different radial locations of polish pad 30. Thus, polish apparatus 10 is capable of detecting the states of multiple radial locations on polish pad 30 by executing the measuring process step. That is, polish apparatus 10 is capable of detecting the state of polish pad 30 over a wide region of polish pad 30. Thus, it is possible to allow polish apparatus 10 to have elaborate control over polish condition settings.

Fifth Embodiment

Figure 9:
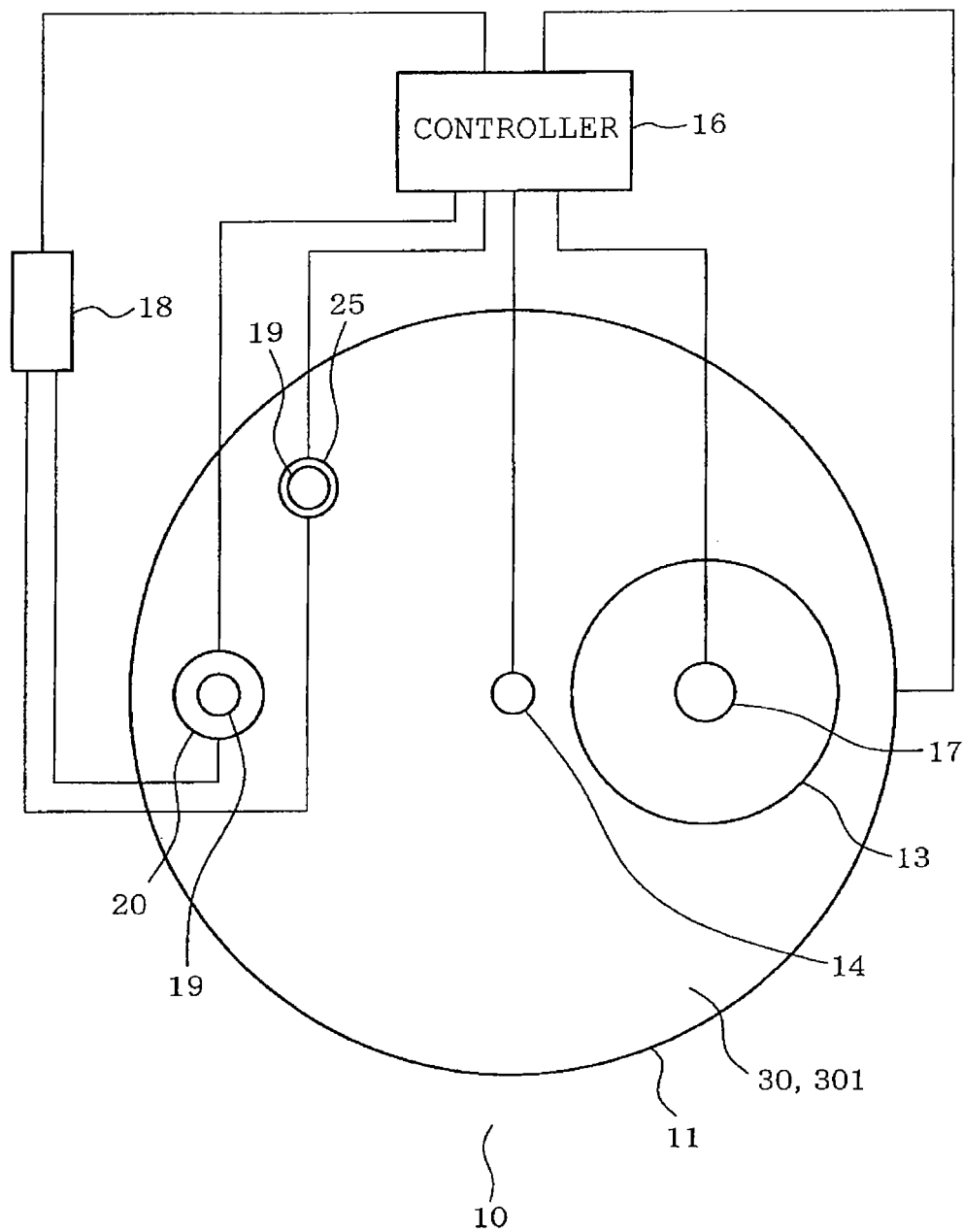
FIG. 9 pertains to a fifth embodiment and is one example of a plan view illustrating an overall view of a polish apparatus.

Next a description will be given on a fifth embodiment with reference to FIG. 9. In the fifth embodiment, polish apparatus 10 is provided with a plurality of indenters, namely indenter 20 and indenter 25. Indenter 20 and indenter 25 are disposed so as to be circumferentially displaced on a circumference of a circle concentric with the rotation center of table 11. Indenter 20 and indenter 25 are held by indenter holders having the same structure. In this example, indenter 20 and indenter 25 are pressed against polish surface 301 of polish pad 30 at equal load. Indenter 20 and indenter 25 are configured to contact polish surface 301 with different contact areas, meaning that either contact area is greater than the other. As a result, the level of pressure applied to polish surface 301 by indenter 20 differs from the level of pressure applied to polish surface 301 by indenter 25. In this example, contact areas of indenter 20 and indenter 25 may be specified so as to be suitable with the level of pressure applied to wafer 40.

Employing indenters 20 and 25 described above allows the state of polish pad 30 dependent on multiple pressure levels, in other words, the polish rate to be detected without changing the pressure applied by indenter holder 19. As a result, polish apparatus 10 is enabled to specify more appropriate polish conditions and thereby allowed to reduce the influence of the change in the state of polish pad 30 caused by polishing. It is thus, possible to reduce the variation in the polish results of wafer 40 and thereby improves productivity.

The end point detection in the polish process of wafer 40 may be carried out for example by measuring the variation in the value of current at table driving portion 12 when table 11 is rotated once. In such case, the resistance incurred by polish pad 30 varies by the variation in the friction coefficient resulting from the deformation of the polish target layer as the polishing progresses. As a result, polish apparatus 10 is enabled to detect the end points of polishing of the polish target layer.

Further, polish apparatus 10 in each of the foregoing embodiments is provided with a dresser not illustrated. The dresser carries out dressing of polish pad 30 in which polish surface 301 of polish pad 30 is scraped to expose a new polish surface. Polish apparatus 10 may be configured to determine the state of polish pad 30 based on the result of measurement obtained in the measurement process and specify the conditions applied in the dressing based on the result of measurement.

The polish apparatus described in the foregoing embodiments is provided with a rotatable table configured to receive a polish pad having a polish surface; a polish head configured to hold a polish object and configured to be capable of placing the polish object in contact with the polish surface while holding the polish object; at least one contact portion being provided with a contact surface and configured to be capable of contacting the polish surface when the table is in rotation; and a measurement portion configured to measure a state of the contact surface of the contact portion being configured to contact the polish surface of the polish pad. In the above described structure, the measurement portion measures the state of the contact surface of the contact portion being placed in contact with the polish surface during the polish operation in which the table is in rotation. Thus, the polish apparatus is capable of detecting the current state of the polish pad.

Further, the polish method and the method of manufacturing a semiconductor device in the foregoing embodiments include measuring a state of a contact portion by placing the contact portion in contact with a polish surface of a polish pad during a polish operation; determining a state of the polish pad based on a result of the measuring; and polishing a polish object, based on a result of the determining, by placing the polish object in contact with the polish surface. In the above described method, it is possible to specify the polish conditions suitable to the current state of polish pad and determine whether to allow/disallow the use of polish pad before or during the actual polishing of the polish object. It is thus, possible to reduce the influence of the change in the state of the polish pad caused by polishing and thereby reduce the variation in the polish result of the polish object which in turn improves productivity.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A polish apparatus comprising:
    a rotatable table configured to receive a polish pad having a polish surface;
    a polish head configured to hold a polish object and configured to place the polish object in contact with the polish surface while holding the polish object;
    at least one contact portion being structurally independent from the polish head and being provided with a contact surface, the contact portion being configured to contact the polish surface when the table is in rotation;
    a measurement portion configured to measure a state of the contact surface of the contact portion that contacts the polish surface of the polish pad;
    a table drive portion configured to drive the rotatable table;
    a polish head drive portion configured to drive the polish head; and
    a controller configured to control the table drive portion and the polish head drive portion, wherein
    the controller is configured to evaluate a state of the polish pad based on the measured state of the contact surface of the contact portion, and is configured to determine whether or not to replace the polish pad or to specify polish conditions based on the evaluated state of the polish pad.

2. The apparatus according to claim 1, wherein the contact surface of the contact portion that contacts the polish surface is formed of a same material as a polish target layer of the polish object.

3. The apparatus according to claim 1, wherein the contact surface of the contact portion that contacts the polish surface is formed of a same material as a stopper layer of the polish object.

4. The apparatus according to claim 1, wherein the contact surface of the contact portion that contacts the polish surface is formed of a metal material, a silicon oxide, or a silicon nitride.

5. The apparatus according to claim 1, wherein the measurement portion is embedded into the rotatable table.

6. The apparatus according to claim 1, wherein the measurement portion is configured to detect a polish end point of the polish object.

7. The apparatus according to claim 1, wherein the measurement portion is configured to measure a variation in a polish rate of the contact surface of the contact portion that contacts the polish surface.

8. The apparatus according to claim 1, wherein the measurement portion comprises an eddy current sensor.

9. The apparatus according to claim 1, wherein the measurement portion comprises an optical sensor.

10. The apparatus according to claim 1 comprising two or more contact portions, wherein each contact surface of the contact portions that contacts the polish surface is formed of a same material as a polish target layer of the polish object or a same material as a stopper layer of the polish object.

11. The apparatus according to claim 1 comprising two or more contact portions, wherein the contact portions are disposed so as to be displaced from one another in a radial direction of the rotatable table.

12. The apparatus according to claim 1 comprising two or more contact portions, wherein the contact portions are disposed so as to be displaced from one another in a circumferential direction of a circle concentric with a rotation center of the rotatable table.

13. The apparatus according to claim 1, wherein the measurement portion is configured to measure a state of the contact surface of the contact portion by measuring variation in a resonant frequency of the contact portion.

14. The apparatus according to claim 13, wherein the measurement portion is provided with an oscillator.

15. The apparatus according to claim 1, wherein the contact portion is configured to adsorb a surfactant contained in a slurry, and the measurement portion is configured to measure an amount of the surfactant adsorbed by the contact portion.

* * * * *